United States Patent [19]

Maureira et al.

[11] Patent Number: 5,416,418
[45] Date of Patent: May 16, 1995

[54] METHOD AND APPARATUS FOR DETERMINING PARTIAL DISCHARGE SITES IN CABLES

[75] Inventors: Hugo A. Maureira; Gary L. Ford, both of Mississauga, Canada

[73] Assignee: Electric Power Research Institute, Inc., Palo Alto, Calif.

[21] Appl. No.: 101,474

[22] Filed: Aug. 2, 1993

[51] Int. Cl.⁶ .......................................... G01R 31/08
[52] U.S. Cl. .................... 324/535; 324/532; 324/536
[58] Field of Search ............... 324/512, 527, 532, 535, 324/536

[56] References Cited

U.S. PATENT DOCUMENTS

| | | | |
|---|---|---|---|
| 2,493,800 | 1/1950 | Biskeborn | 324/532 |
| 2,628,267 | 2/1953 | Stringfield et al. | 175/183 |
| 2,717,992 | 9/1956 | Weintraub | 340/253 |
| 3,462,681 | 8/1969 | Biskup | 324/52 |
| 3,609,533 | 9/1971 | Pardis | 324/52 |
| 3,991,364 | 11/1976 | Wiznerowicz | 324/52 |
| 4,500,834 | 2/1985 | Ko et al. | 324/52 |
| 4,887,041 | 12/1989 | Mashikian et al. | 324/533 |
| 5,243,294 | 9/1993 | Burnett | 324/535 |

Primary Examiner—Kenneth A. Wieder
Assistant Examiner—Glenn W. Brown
Attorney, Agent, or Firm—Leonard Bloom

[57] ABSTRACT

A low cost method and apparatus for locating the site(s) of partial discharges in electrical distribution lines without use of reflectometry or a separate sensor-to-sensor communication channel.

3 Claims, 5 Drawing Sheets

METHOD AND APPARATUS FOR DETERMINING PARTIAL DISCHARGE SITES IN CABLES

FIELD OF THE INVENTION

The present invention relates to partial discharges which may occur along electric power distribution and/or power transmission cables as the result of non-catastrophic defects such as holes in the insulation and, more particularly, to a method and apparatus for determining the site along a cable at which partial discharges are occurring.

BACKGROUND OF THE INVENTION

Partial discharges may occur along the cables of electric power transmission and/or distribution systems when localized imperfections develop in the cable insulation. For instance, a cavity in the cable insulation may well cause partial discharges under normal operating conditions or under test conditions with the cable energized at higher than rated voltage.

When a partial discharge ("PD") occurs, high frequency current and voltage pulses emanate from the site of the discharge. This is a symptom of the presence of insulation defects which must be located and assessed. A decision can then be made as to whether the cable must be repaired or replaced. In time, unattended defects may significantly deteriorate due to a combination of factors such as thermal cycling, mechanical fatigue, embrittlement, and moisture ingression. This may lead to a high concentration of electrical stress at the particular location and ultimately voltage breakdown through the insulation. Such electrical fault is normally safely cleared by properly designed protective devices. It is conceivable that some damage may still occur. Furthermore, service is interrupted for the duration of emergency repairs. The adverse economic consequences resulting from a fault may therefore be significant.

It is far more cost effective to detect partial discharging activity and determine its location soon after such conditions arise. Further diagnosis and scheduled preventive maintenance may then proceed.

Prior efforts have been made at automatic detection of fault sites along transmission lines and of fault and partial discharge sites along power cables. A majority of these efforts calculate fault (or partial discharge) location based on the propagation time of a transient fault (or partial discharge) signal.

For example, U.S. Pat. No. 4,500,834 issued to Ko et al. uses the method of reflectometry to locate ground faults or line-to-line faults. Unfortunately, conventional reflectometry may not be suitable for locating partial discharge sites due to the presence of significant levels of electrical noise and/or propagation losses. Since reflected pulses become weaker and distorted for techniques using multiple reflections from the terminals under partial discharge conditions, reflectometry is inappropriate for power cables which may extend for several miles.

Partial discharge ("PD") signals are usually very weak compared to noise. Location of PD sites using reflectometry (also known as time domain reflection or TDR methods) requires multiple reflections from the ends of the cable. As a result, the low level PD signals having to propagate over substantial distances, are further attenuated becoming difficult or impossible to measure in practice.

This limitation of reflectometry or TDR methods, is a particularly serious disadvantage when such methods are applied to lossy cables (e.g., oil paper insulated, butyl insulated, etc., and cables with resistive or no shields). Therefore, attenuation of PD signals would make conventional PD detection and location methods using TDR ineffective for lossy cables as well as, for similar reasons, for long runs of low loss cables.

The PD signal attenuation problem can, in principle, be alleviated if a second low loss cable is provided to return PD signals from the far end of the cable to the near end; this is in itself of obvious disadvantage and is impractical in most real cable installations.

Other patents, such as U.S. Pat. No. 2,717,992 to Weintraub, disclose fault location without reflectometry. These references generally show two sensors spaced along the distribution cable. Both sensors detect a propagating fault signal from a fault occurring somewhere in between, and the times of detection are centrally processed to indicate the distance of the fault from the sensors. Although the limitations of reflectometry are avoided, a separate communication channel is required from each sensor to allow centralized processing of the data; and this is a costly proposition.

An alternative arrangement can be found in U.S. Pat. No. 3,609,533 issued to Pardis et al. This reference also discloses two spaced sensors for locating faults occurring therebetween on a transmission line. However, a pulse generator 28 is provided at one sensor. When a fault signal is detected, the pulse generator is triggered to impart a timing pulse back onto the transmission line. The pulse backtracks to the second sensor, and the fault location can be determined from the time interval between the fault and timing pulses received at the second sensor. By utilizing the transmission line itself, this arrangement eliminates the need for separate communication channels. However, the Pardis et al. arrangement is designed to detect break-down wavefronts emanating from faults such as caused by lightning strikes. These wavefronts have magnitudes in the 10–100 kV range or higher. The device is ill-suited for use in detecting partial discharges, which are extremely high-frequency transient pulses (faster than propagating wavefronts by an order of magnitude), and which attain a diminutive amplitude in the millivolt range.

Pardis makes no reference to the unique problems that are encountered in partial discharge measurements. This Pardis system does not address the difficulties associated with the detection of much faster signals of diminutive magnitude, propagating in lossy mediums and measured in the presence of background noise. Pardis' system as conceived could not be used for PD detection, nor could its adaptation to that purpose be obvious to someone skilled in the art. Another difference from the present invention is in the way that Pardis measures the difference in time of arrival at the measuring station, between the first-to-arrive fault signal and the second-to-arrive injected pulse. In Pardis case, the time of arrival of the first pulse is extended by a fixed long delay; so that to the time difference measuring device, this first pulse appears as if it was the second-to-arrive at the measuring station.

The delay added has to be subtracted to arrive at the actual time differential from which the location of the fault is calculated. This way of measurement is less accurate than the present invention's due to the increased measurement and computational error associated with the offset created by the fixed delay. Finally, Pardis emphasizes the fact that his invention relates to a system, that is, to a particular way of implementing a fault location scheme.

In summary, there would be clear commercial advantage in a low cost method and apparatus for specifically locating the site(s) of partial discharges.

SUMMARY OF THE INVENTION

It is, therefore, an object of the present invention to provide a low cost method and apparatus for specifically locating the site(s) of partial discharges of high-frequency transient pulses with diminutive amplitudes in the millivolt range.

It is another object of the invention to locate partial discharges while avoiding reflectometry techniques and eliminating the need for a separate communication channel from each sensor to a central processor.

The present invention accomplishes these and other objects by a method and apparatus for determining partial discharge sites in cables.

According to one embodiment, the method of the invention comprises the steps of detecting a first transient pulse at a first sensor (the first sensor being coupled to a distribution cable on one side of a partial discharge site) when the first transient pulse has propagated thereto from the partial discharge site, detecting a second transient pulse at a second sensor (the second sensor being coupled to the cable on the other side of the partial discharge site) when the second transient pulse has propagated thereto from the partial discharge site, imparting a third transient pulse back onto the cable at the second sensor in response to the detection of the second transient pulse, detecting the third transient pulse at the first sensor when the third transient pulse has propagated back to the first sensor, measuring the time differential between detecting the first transient pulse and the third transient pulse at the first sensor, and calculating the distance of the partial discharge site from one of said first and second sensors based on the time differential.

According to another embodiment of the present invention, the apparatus for carrying out the above-described method comprises a first sensor coupled to the cable for detecting the first transient pulse propagating directly thereto from the partial discharge site, the first sensor being spaced on one side of the partial discharge site, a second sensor coupled to the cable for detecting the second transient pulse propagating directly thereto from the partial discharge site, the second sensor being spaced on the other side of the partial discharge site, a trigger device coupled to the second sensor and actuable thereby to output a trigger signal, a pulse generator connected to the trigger device and the second sensor, the pulse generator being activated by the trigger signal to impart the third transient pulse back onto the cable at the second sensor, whereby the third transient pulse propagates back to the first sensor and is detected thereby, a timing measurement device connected to the first sensor for measuring the time differential between detecting the first and third transient pulses at the first sensor, the time differential corresponding to the distance of the partial discharge site from one of said first and second sensors.

Viewed in another aspect, the time measuring device is triggerable by (i.e., set to respond to) the distinctly strong third pulse so that it marks the instant of reference or time t=0; the full time scale includes a negative or pretrigger range which allows measurement of the above time differential since the first pulse is detected prior to triggering the time measuring device.

The present invention also provides an improved test procedure.

Other objects, features, and advantages of the present invention will become more apparent from the following detailed description of preferred embodiments and certain modifications thereof when taken together with the accompanying drawings.

DETAILED DESCRIPTION OF THE PREFERRED EMBODIMENT(S)

With reference to the drawings, a cable 2 (of known length l) may be any conventional electrical power cable as, for example, a butyl insulated triplex cable. For test purposes in the field, cable 2 is isolated from its in-service circuit; and cable 2 is then typically energized by a high voltage source represented in FIG. 1 by a PD-free adjustable transformer T. Transformer T is capable of supplying high enough voltage to adequately stress the cable 2 and induce PD activity where insulation defects may exist.

Figure 1:
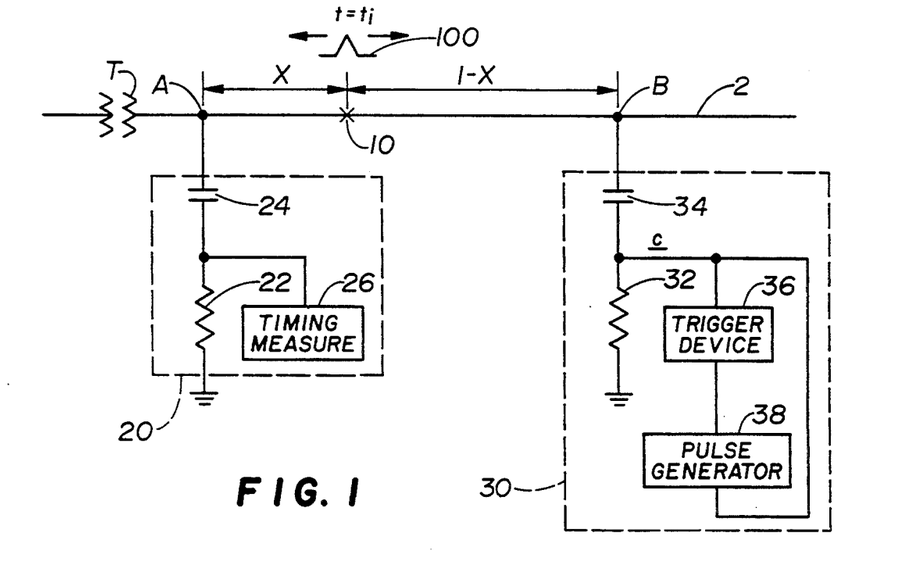
FIG. 1 illustrates a preferred embodiment of the present invention for determining the site along a cable at which partial discharges are occurring.

Site 10 indicates the location at which a partial discharge occurs as the result of an insulation defect or the like. Upon exceeding a certain threshold or inception voltage, high frequency current and voltage pulses immediately emanate from site 10. For purposes of illustration, the invention will be described with reference to a partial discharge voltage pulse which occurs at an initial time $t=t_1$ and propagates bidirectionally toward points A and B. It should be noted, however, that the measured pulse need not be the initial voltage pulse, and may be a current pulse rather than a voltage pulse. The pick up detectors at the ends of the cable can be designed to recognize either one or both types of pulse; and for the purpose of this invention, this is immaterial.

Partial discharge pick-up detectors (or sensors) 20 and 30, respectively, are installed proximate respective ends of the cable 2 (essentially, at the ends). Both partial discharge pickup detectors 20 and 30 employ suitable coupling networks designed to accurately pass only the high frequency components that characterize a partial discharge pulse. Specifically, for a voltage pulse, the first partial discharge pick-up detector 20 comprises a high-frequency series-connected capacitor-resistor voltage divider network including a resistor 22 and a capacitor 24. Likewise, the second partial discharge pick-up detector 30 comprises a resistor 32 and a capacitor 34 connected as shown. It will be appreciated by those skilled in the art, however, that use of R-C dividers (as described above) is not a restriction and other forms of detection sensors can be used.

In addition, partial discharge pick-up detector 20 includes a timing measurement device 26 connected between capacitor 24 and resistor 22. Timing measurement device 26 may be a conventional oscilloscope, waveform digitizer, digital counter or other device capable of timing the interval between two high-frequency pulses.

Partial discharge pick-up detector 30 includes a feedback loop comprising a trigger device 36 taking its input from the R-C divider and with a trigger output coupled to a pulse generator 38. The trigger device 36 is capable of selectively outputting a trigger signal in accordance with a pulse input of proper amplitude and period to thereby trigger pulse generator 38 upon the occurrence of a legitimate partial discharge signal. The output of pulse generator 38 is coupled to the junction of the trigger device 36, capacitor 32, and resistor 34 as shown. The output of pulse generator 38 is thus passed to the cable through capacitor 32.

Figure 5A:
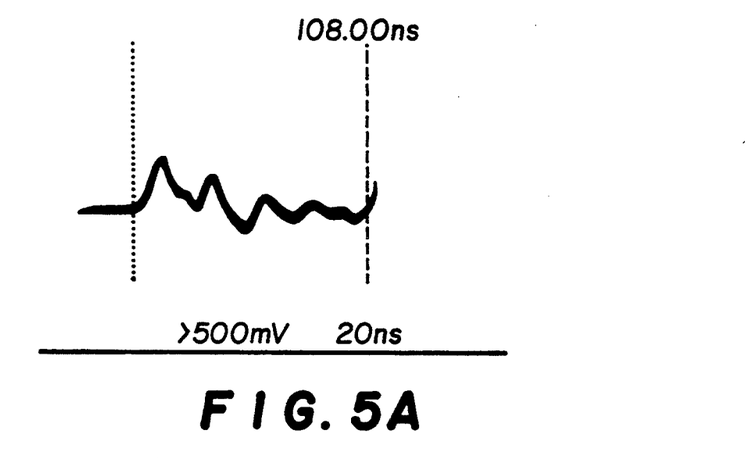
FIG. 5A and 5B are traces showing the generation of a large fast-rising pulse (at the right) in response to a small P.D. pulse (at the left).
Figure 5B:
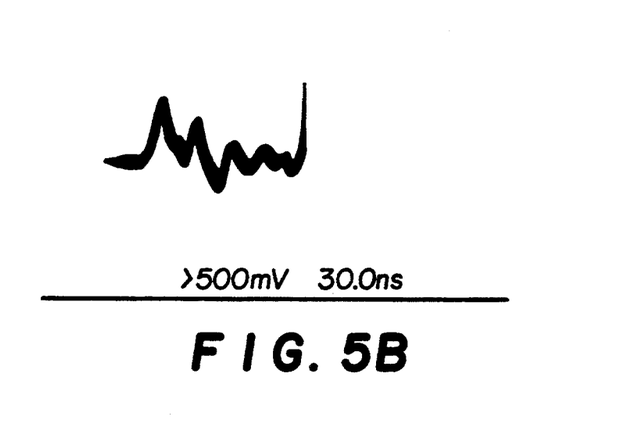

The pulse generator 38 outputs a fast rising pulse of typically five nanoseconds (or less) rise time and having a high magnitude (typically one to five volts or higher) as shown in FIGS. 5A and 5B. The pulse width and shape are not important, and the pulse width may be much wider than typical PD pulses.

Partial discharge pick-up detector 20 is coupled to cable 2 at a point A which is spaced by an unknown distance x from partial discharge site 10. Partial discharge pick-up detector 30 is coupled to cable 2 at a point B which is spaced by an unknown distance $-1x$ from partial discharge site 10.

The operation of the embodiment of FIG. 1 will be described with further reference to FIG. 2. As shown in the upper trace of FIG. 2, the initial pulse 100 propagates a distance x from partial discharge site 10 towards point A and arrives at point A at time $t_x$. At the same time (and as shown in the middle trace of FIG. 2), initial pulse 100 propagates in the opposite direction a distance $1-x$ from partial discharge site 10 toward point B and arrives at point B at time $t_{1-x}$. At point B, the pulse 100 passes capacitor 34 and trips the trigger device 36. No delay is added on purpose; rather, just what may result from the usual response time of a device in general. Pulse generator 38 imparts a pulse of large magnitude and steep front. For sake of example (but not of necessity) this pulse is rectangular and very wide, effectively a step output 200 which is passed to the cable through capacitor 34.

It is essential to the present invention that the injected step output has a fast rise-time in the order of approximately one to five nanoseconds, such slope being comparable to that of a typical partial discharge pulse leading edge (or faster). This is of direct advantage to a high measurement resolution when this pulse is used as a timing reference. This is because the pulse's leading edge slope tapers and generally the pulse shape is distorted with distance as a result of propagation losses. A very pronounced slope is an imprecise timing reference if the desired resolution of measurement is comparable to the pulse rise time.

Figure 2:
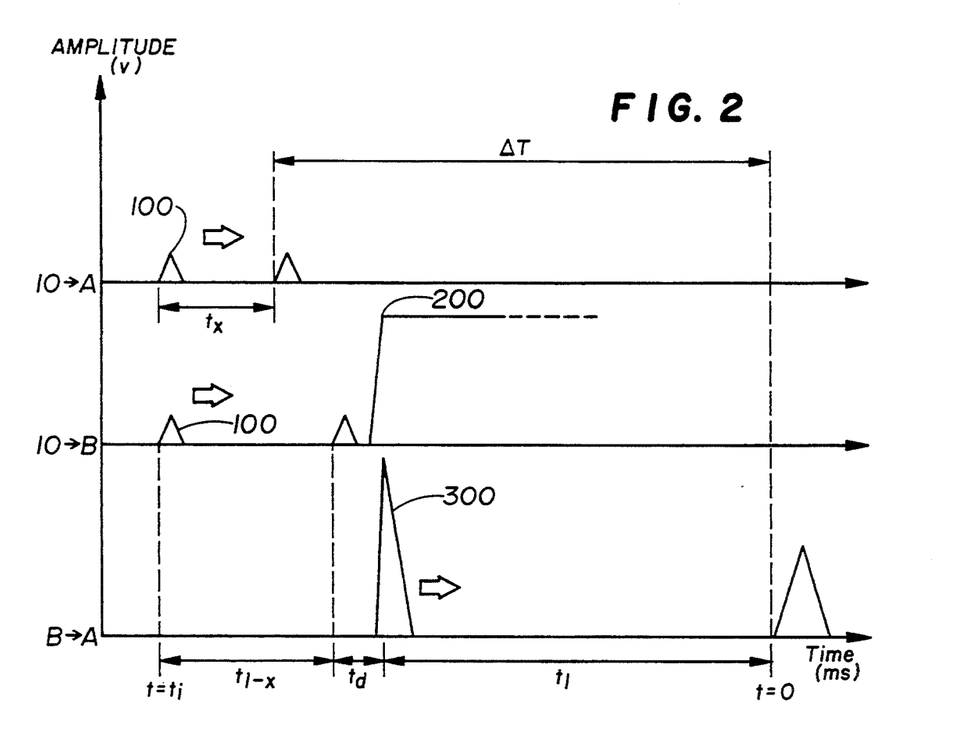
FIG. 2 shows a trace diagram of the bi-directional propagation of a partial discharge pulse from partial discharge site 10 toward points A and B in the circuit of FIG. 1 and the propagation of the imparted pulse from point B back to point A.

As shown in the lower trace of FIG. 2, the step output 200 is filtered by capacitor 34 (only high frequency contents in leading edge allowed to pass) and appears as a spike 300 on cable 2. The length of the delay $t_d$ between pulse 100 and spike 300 is the sum of the response time of trigger device 36 and pulse generator 38 plus the propagation time through the feedback loop. The length of the connection between capacitor 34, trigger device 36, and pulse generator 38 must be either negligibly short relative to length l of cable 2, or a resulting additional delay must be added to $t_d$. Spike 300 propagates along cable 2 back toward point A over a distance l.

The return spike 300 passes point 10 after a time of $t_{1-x}$ and continues to point A in an additional time of $t_x$. Hence, the total elapsed time $t_{300}$ to detect spike 300 at detector 20 and elapsed time $t_{100}$ to detect the partial discharge pulse 100 at detector 20, from occurrence of the partial discharge, are expressed as follows:

$$t_{300} = 2(t_{1-x}) + t_x + t_d$$

$$t_{100} t_x$$

The time difference of arrival or interval $\Delta T = t_{300} - t_{100}$ is therefore $\Delta T = 2t_{l-x} + t_d$.

Measurement device 26 (typically an oscilloscope) displays the original leading pulse 100 from the partial discharge followed by the return spike 300, and thereby allows a measurement of the time difference of arrival $\Delta T$. Depending on the type of device 26 used in practice, pulses may not necessarily be visually displayed to measure the above parameter $\Delta T$. For instance a digital counter or similar device could be used to that effect. The time difference $\Delta T$ may be restated as follows:

$$\Delta T = t_d + 2\left(\frac{l + c - x}{v}\right)$$

where the length of the connection c is in practice negligible relative to l, and v is equal to the pulse propagation speed through the dielectric medium of cable 2, which speed can be measured for specific cables as in set up step of test procedure described hereunder.

The equation can readily be solved to determine the unknown parameter x, which represents an accurate determination of the distance from detector 20 of partial discharge site 10.

Using the above-described method and apparatus, the location of partial discharge sites occurring anywhere between points A and B can be accurately determined.

Figure 3:
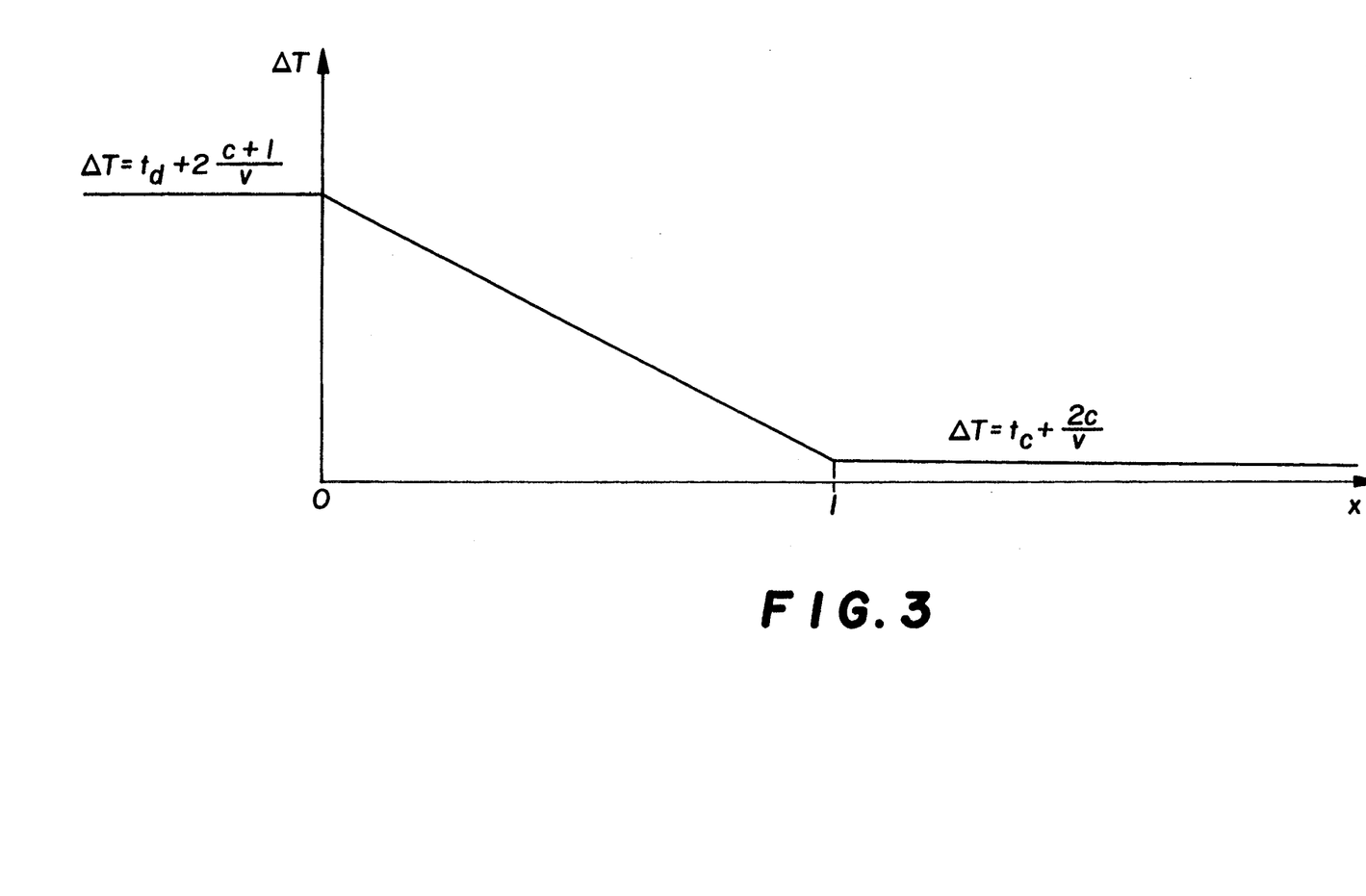
FIG. 3 illustrates the relationship between the differential time of arrival (or interval) vs. the distance between of the partial discharge site 10 and point A in the circuit of FIG. 1.

The relationship between the differential time $\Delta T$ and the distance x between the partial discharge site 10 and detector 20 is shown in FIG. 3. In FIG. 3, the location of any partial discharge site along the length l (separating the sensors 20 and 30 in FIG. 1) is well determined.

Depending on the particular results obtained, it may be advantageous to reverse the detection setups 1 and 2 with respect to the two ends of the cable. This is of clear advantage to improve the accuracy if x is almost as large as l (hence $\Delta T$ near zero). Also, by taking alternative measurements of $\Delta T$ from each end of the power cable and by a simple subtraction of these values of $\Delta T$, to obtain x in terms of the resulting difference, the offset effect of $t_d$ and c is readily cancelled out; that is, x is conveniently obtained independently of $t_d$ and c. To facilitate alternative measurements of $\Delta T$ from both ends the two different detection/measurement schemes shown in FIG. 1 could be repeated or duplicate setups.

The method of the present invention is particularly suited to lossy cables, in which the losses are due to a great length, dielectric material properties, or both. The method is also advantageous if the cable has a poorly conductive shield or if the grounding system is discontinuous (e.g., discontinuous run of steel trays or other support structure) or to cables for which a conventional double ended technique is not practical. Doubleended technique requires to set up low loss cables to connect sensors at each end of cable under test to the common location of a test station. The physical layout to add these extra cables as temporary installation is a problem.

The method is an improvement because conventional reflectometry methods rely on the recognition of reflected pulses. Reflectometry may not be possible in the presence of significant levels of electrical noise and/or propagation losses since the reflected pulses become increasingly weaker and distorted.

Moreover, there is no limitation as to the minimum cable length for which the technique could be applied, and the maximum testable cable length far exceeds that of the conventional reflectometry techniques.

The above-described method of the present invention has been successfully tested using an experimental apparatus. The test cable was a 10 m-long butyl insulated triplex cable lying flat on a steel tray.

Figure 4:
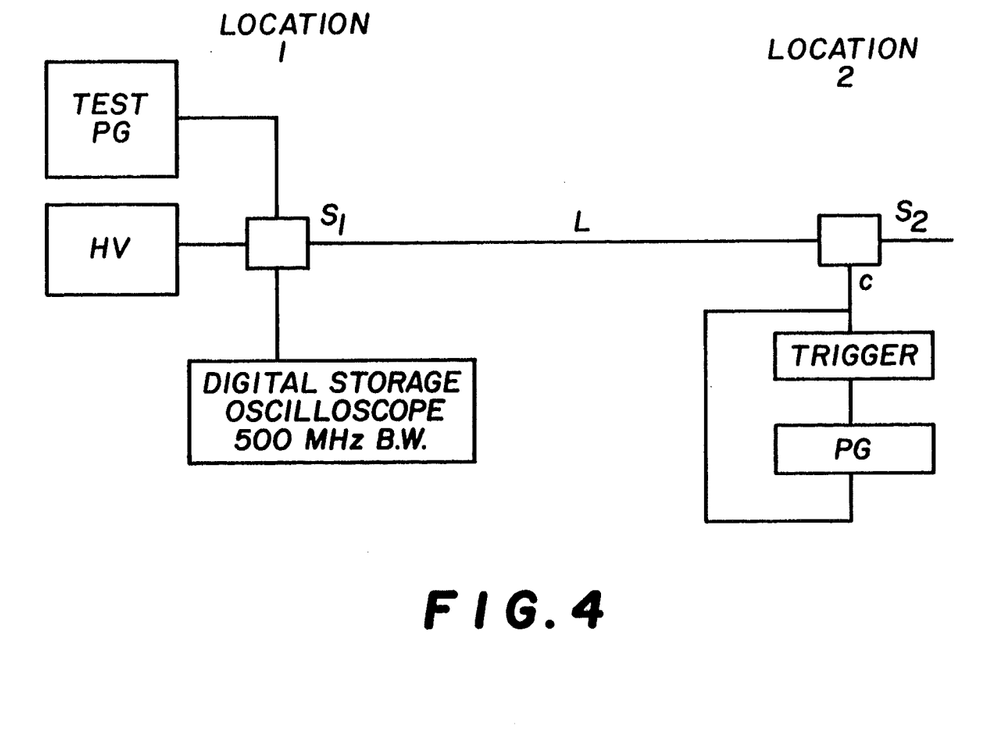
FIG. 4 is a schematic diagram illustrating the preferred test procedure used to carry out the method of the present invention.

With reference to FIG. 4, the test procedure used to carry out the above-described method consists of two steps including set up A and measurements B which are described as follows:

A SET UP

A1. With the high voltage supply HV connected but at 0 volts, set PG trigger level as low as possible but above noise levels, so that PG will not be triggered by noise but by PD signals.

A2. With Test PG at location 1 apply low level pulses i.e., 1-5 mV simulating PD signals and ensure that PG at location 2 responds. Set digital storage Oscilloscope trigger level high so that it responds only to PG pulses, PG pulses being of a magnitude significantly greater than the typical PD pulse.

A3. Find the low level pulse from test PG in the scope pre trigger range and measure the elapsed time, $\Delta T$, with respect to the large trigger pulse from PG. This corresponds to twice the propagation distance. For a known cable length, l, the propagation speed is therefore readily obtained as $v = 2(1+c)/\Delta T - t_d)$, where c is the length of test connection from sensor $S_2$, shown in FIG. 4, and $t_t$ is the combined response time of the trigger device and pulse generator PG in FIG. 4.

B MEASUREMENTS

B1. With "test PG" removed and trigger levels set as in set up (i.e., PG not triggered by noise but low enough to be triggered by PD pulses if they are created).

B2. Slowly raise voltage supplied by HV and observe if the oscilloscope triggers. When it does, examine pre trigger waveform at expanded time and voltage scales to display the PD signal which was received at S1 and which was also received at S2 to cause PG to be triggered.

B3. If the signal received at S1 as discussed in B2 above, is of the characteristic PD shape record the time delay $\Delta t$ with respect to the timing pulse from PG which triggered the oscilloscope.

B4. Repeat to ensure repeatability and consistency. Digital time difference recording and averaging is useful to accumulate statistics; but individual waveforms are usually sufficient to determine the PD site (source) location.

Tests were carried out with a triplex, butyl insulated unshielded cable, 9.74 m long, laid flat on an electrically grounded steel tray. One phase (red) was energized to 6000 volts with respect to the other two phases (black and white) which were electrically tied to each other and to the ground at the electrically grounded steel tray. PD detection sensors $S_1$, $S_2$ were installed near the cable ends spaced a distance l=8.64 m apart.

An HP54111D digital storage scope was used for measurement of time interval $\Delta T$ at sensor $S_1$.

A Tektronix (Model 2467B) broad band analog oscilloscope with digital output (responding to incoming PD signal from sensor $S_2$) was used as the trigger device to trigger a pulse generator whose output was sent back to sensor $S_2$.

Figure 6:
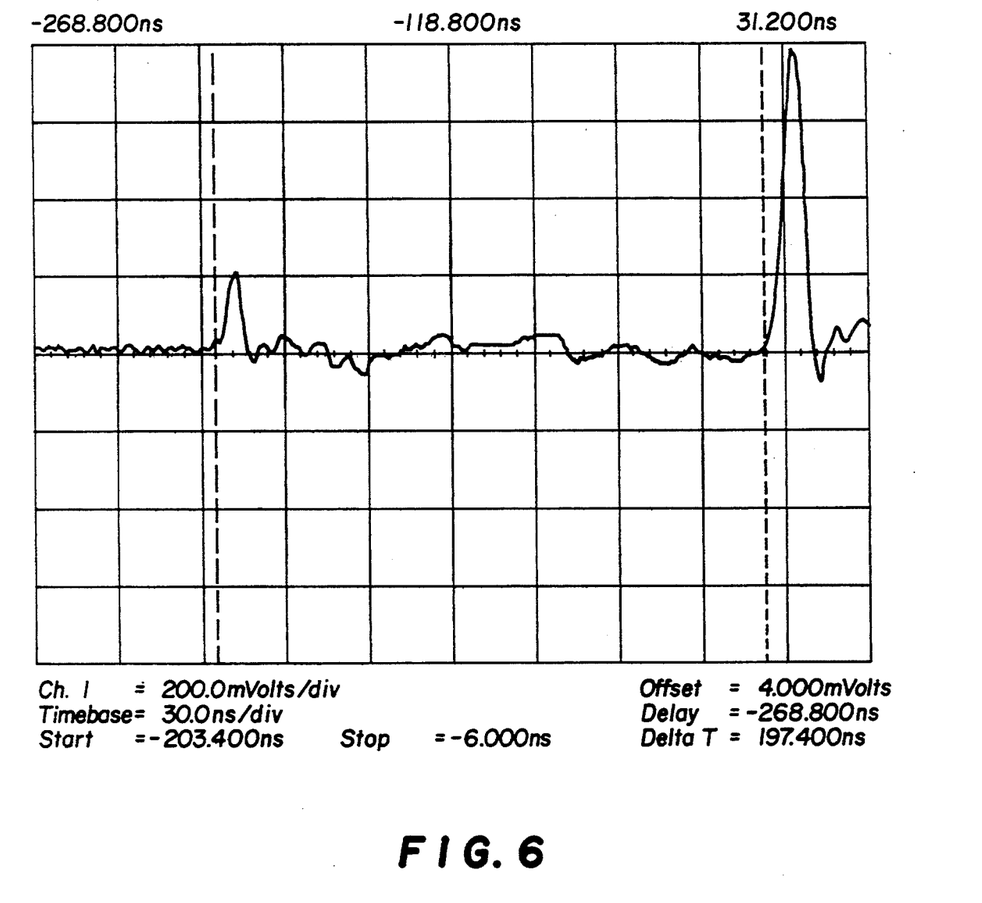
FIG. 6 shows the time interval between the arrival of a small P.D. pulse (at the left) and a large timing pulse (at the right).

The following test data is presented:

a) Length of test connection from sensor $S_2$ c=2 m;
b) known propagation speed v=0.18 m/ns (1 ns=$10^{-9}$s);
c) Time delay due to combined response time of trigger device and pulse generator $t_d$=108 ns as per FIG. 5A (attached);
d) Measured time difference between arrival at $S_1$ of small PD pulse and subsequent large timing pulse, $\Delta T$=197.4 ns as per FIG. 6 (attached); and
e) Location of PD site calculated from above data $$\Delta T = 2 \frac{l + c - x}{v} + t_d$$

$$x = 2.59 \text{ m}$$

where x is the distance from sensor $S_1$.

Having now fully set forth the preferred embodiments and certain modifications of the concept underlying the present invention, various other embodiments as well as certain variations and modifications of the embodiments herein described will obviously occur to those skilled in the art upon becoming familiar with said underlying concept. It is to be understood, therefore, that within the scope of the appended claims, the invention may be practiced otherwise than as specifically set forth herein.

We claim:

1. A method for locating a site of a partial discharge occurring along an electric power cable, said method comprising the steps of:

detecting a first transient pulse at a first sensor coupled to said cable on one side of said partial discharge site, said first transient pulse being a high frequency signal of diminutive magnitude in the millivolt range propagating thereto from said partial discharge;

detecting a second transient pulse at a second sensor coupled to said cable on another side of said partial discharge site, said second transient pulse being a high frequency signal of diminutive magnitude in the millivolt range propagating thereto from said partial discharge site;

imparting a third transient pulse back onto said cable at said second sensor substantially immediately upon said detection of said second transient pulse, said third transient pulse being a signal of magnitude in the volt range having a steep front;

detecting said third transient pulse at said first sensor when said third transient pulse has propagated back to said first sensor;

measuring a differential time between detecting said first transient pulse at said first sensor and detecting said third transient pulse at said first sensor; and calculating a distance of said partial discharge location from one of said first and second sensors based on said differential time.

2. An apparatus for locating a site of a partial discharge occurring along an electric power cable, comprising:

a first sensor coupled to said cable for detecting a first transient high-frequency pulse of diminutive magnitude in the millivolt range propagating directly thereto from said partial discharge, said first sensor being spaced on one side of said partial discharge site;

a second sensor coupled to said cable for detecting a second transient high-frequency pulse of diminutive magnitude in the millivolt range propagating directly thereto from said partial discharge, said second sensor being spaced on another side of said partial discharge site;

a trigger device coupled to said second sensor and actuable thereby upon detection of said second transient pulse to output a trigger signal;

a pulse generator connected to said trigger device and coupled to said second sensor, said pulse generator being activated by said trigger signal to impart a third transient pulse back onto said cable at said second sensor substantially immediately upon detection of said second transient pulse at said second sensor, said third transient pulse being a signal of a magnitude in the volt range and having a steep front;

whereby said third transient pulse propagates back to said first sensor and is detected thereby; and a timing measurement device connected to said first sensor for measuring a time between the detection of said first transient pulse and said third transient pulse at said first sensor, said measurement corresponding to a distance of said partial discharge location from one of said first and second sensors.

3. A system for determining the location of a partial discharge site between respective ends of an electric power cable, comprising a first pick-up detector at one end of the cable, the first pick-up detector having a voltage divider including a first resistor and a first capacitor having a junction therebetween, the first pick-up detector further having a timing measurement device connected to the junction of the first resistor and the first capacitor, a second pick-up detector at the other end of the cable, the second pick-up device having a second voltage divider including a second resistor and a second capacitor having a junction therebetween, the second pick-up detector further having a feedback loop including a trigger device and further including a pulse generator, the trigger device having an input and an output, respectively, the pulse generator having an input and an output, respectively, the input of the trigger device being connected to the junction of the second resistor and the second capacitor, the output of the trigger device being connected to the input of the pulse generator, and the output of the pulse generator being connected to the junction of the second resistor and second capacitor.

* * * * *